United States Patent [19]

Tuttle

[11] Patent Number: 5,112,773
[45] Date of Patent: May 12, 1992

[54] METHODS FOR TEXTURIZING POLYSILICON UTILIZING GAS PHASE NUCLEATION

[75] Inventor: Mark E. Tuttle, Boise, Id.

[73] Assignee: Micron Technology, Inc., Boise, Id.

[21] Appl. No.: 683,215

[22] Filed: Apr. 10, 1991

[51] Int. Cl.$^5$ .......................................... H01L 21/203
[52] U.S. Cl. .................................... 437/109; 437/233; 437/919; 437/967; 437/977
[58] Field of Search ............ 148/DIG. 14, DIG. 122; 437/109, 233, 919, 967, 977

[56] References Cited

U.S. PATENT DOCUMENTS

| | | | |
|---|---|---|---|
| 3,900,597 | 8/1975 | Chruma | 437/233 |
| 4,087,571 | 5/1978 | Kamins et al. | 437/233 |
| 4,489,103 | 12/1984 | Goodman et al. | 437/233 |
| 4,843,032 | 6/1989 | Tokuja et al. | 437/22 |
| 4,897,360 | 1/1990 | Guckel et al. | 437/109 |
| 4,966,861 | 10/1990 | Mieno et al. | 437/99 |
| 5,017,505 | 5/1991 | Fujii et al. | 437/233 |

FOREIGN PATENT DOCUMENTS

| | | | |
|---|---|---|---|
| 57-21814 | 2/1982 | Japan | 437/109 |
| 60-119713 | 6/1985 | Japan | 437/109 |
| 2-281614 | 11/1990 | Japan | 437/109 |

OTHER PUBLICATIONS

Wolf, S., *Silicon Processing for the ULSI Era*, vol. 1, *Process Technology*, 1986, pp. 177–181.

"Rugged Surface Poly-Si Electrode and Low Temperature Deposited Si3N4 for 64mbit and Beyond STC Dram Cell" by M. Yoshimaru et al., pp. 27.4.1–27.4.4, 1990.

Primary Examiner—Olik Chaudhuri
Assistant Examiner—G. Fourson
Attorney, Agent, or Firm—David J. Paul

[57] ABSTRACT

A process for texturization of polycrystalline silicon comprising the steps of utilizing gas phase nucleation by injecting a material to a cause heterogeneous nucleation or by increasing deposition temperature or pressure to cause a homogeneous nucleation of the silicon source itself. Heterogeneous or homogeneous gas phase nucleation causes large, stable textures in the deposited polysilicon that can be doped using conventional fabrication techniques.

16 Claims, 3 Drawing Sheets

METHODS FOR TEXTURIZING POLYSILICON UTILIZING GAS PHASE NUCLEATION

FIELD OF THE INVENTION

This invention relates to semiconductor technology, and more specifically, to processes for imparting a texturized surface to a polycrystalline silicon layer utilizing gas phase nucleation.

BACKGROUND OF THE INVENTION

A process for texturizing polycrystalline silicon (hereinafter also "polysilicon" or "poly") is discussed in an article entitled "Rugged Surface Poly-Si Electrode and Low Temperature Deposited Si3N4 for 64 Mb and Beyond STC DRAM Cell" authored by M. Yoshimaru et al, Oki Electric Industry Co., Ltd., VLSI R&D Laboratory pp. 550-1, Higashiasakawa, Hachioji, Tokyo 193, Japan. In this article, using a poly deposition temperature of 570 degrees Celsius causes the poly layer surface to become rugged (or textured). The article claims that applying this technique to form a storage node cell plate of a dynamic random access memory's (DRAM) storage stacked capacitor, results in an increase of the cell plate's surface area of up to 2.5 times that of a standard stacked capacitor cell (STC).

Two main drawbacks with this method are: 1) the temperature must be precisely controlled (within ±3 degrees C. of 570° C.) during deposition to form the rugged poly surface; and 2) subjecting the rugged poly to temperatures above 570 degrees C. in subsequent process steps can cause the rugged surface to flatten out.

In the present invention, a stable and uniform texturized poly surface is developed that will retain its textured surface throughout implementation of conventional DRAM fabrication processes.

SUMMARY OF THE INVENTION

The present invention is a process for texturizing a polycrystalline silicon (polysilicon or poly) layer to be used as a capacitor's storage node cell plate in semiconductor devices, such as memory devices and in particular dynamic random access memories or DRAMs. The following discussion focuses on using the process developed in the present invention during a conventional stacked capacitor DRAM fabrication process to serve as an example. However, it is understandable that those skilled-in-the-art could apply the techniques described by the present invention to a variety of semiconductor devices where polysilicon is used and it is desired to have that polysilicon take on a texturized surface.

A silicon wafer is fabricated prior to depositing a poly layer to be used as a storage node cell plate of a capacitor in a DRAM array. In this example, a buried digit line contact opening has been prepared for a subsequent deposition of polysilicon that will make contact to the active area of an access device and will later be patterned and doped to serve as a stacked capacitor's storage node cell plate.

Texturization of the poly is accomplished by utilizing gas phase nucleation by injecting a material such as oxygen, water vapor, nitrous oxide, or methane which will cause the polysilicon to nucleate heterogeneously in the gas phase. Alternatively, without injecting a foreign material, decomposition of the silicon source (e.g. silane, disilane, dichlorosilane, trichlorosilane, tetrachlorosilane) itself can be accomplished by changing deposition conditions and results in a homogeneous gas phase nucleation of the polysilicon. Homogeneous gas phase nucleation causes large, stable textures in the deposited polysilicon that can be doped with conventional fabrication techniques such as by insitu doping or by utilizing subsequent doping processes.

Polysilicon texturized in accordance with the processes which constitutes the present invention may be used in a variety of applications and specifically to increase DRAM cell capacitance.

PREFERRED EMBODIMENT OF THE INVENTION

Figure 1:
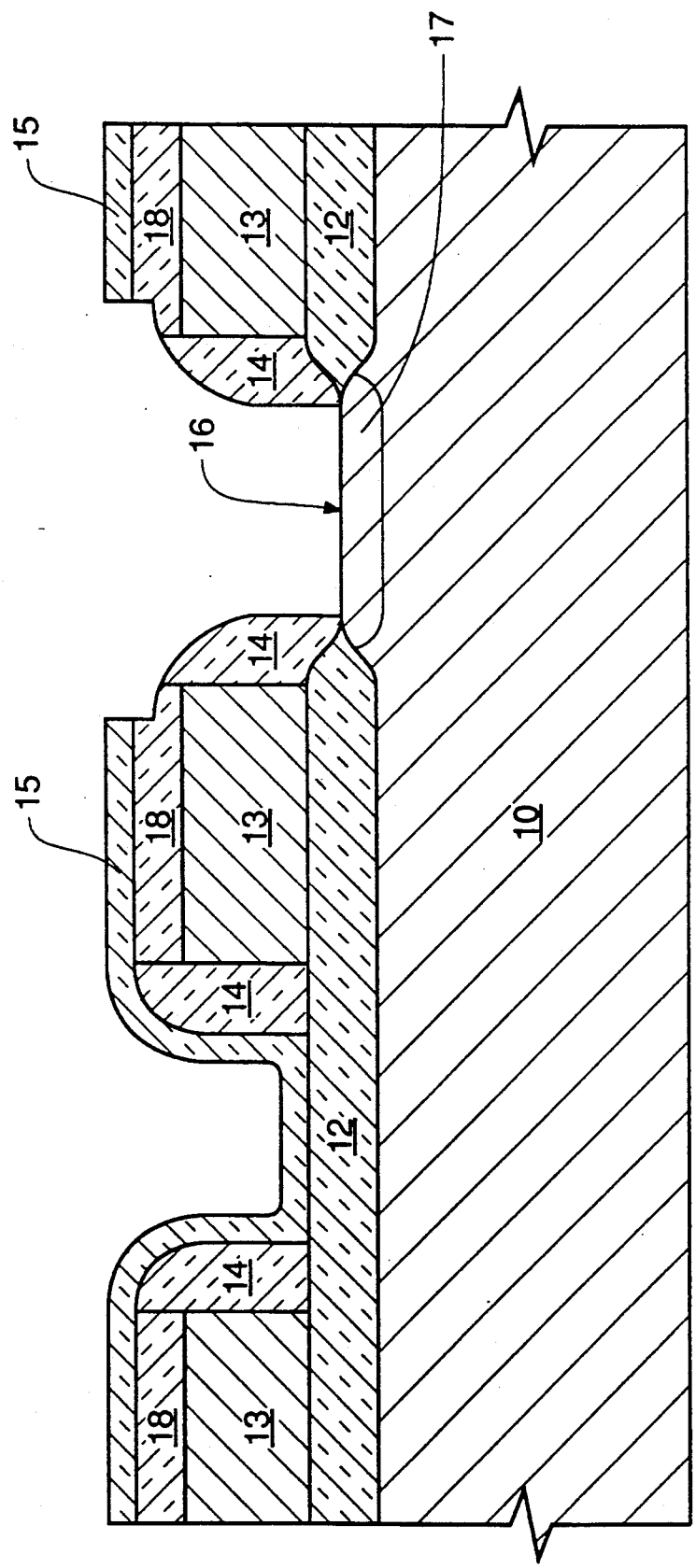
FIG. 1 is a cross-sectional view of a silicon wafer that has been developed up to the point prior to formation of a poly storage node cell plate for a DRAM array.
Figure 2:
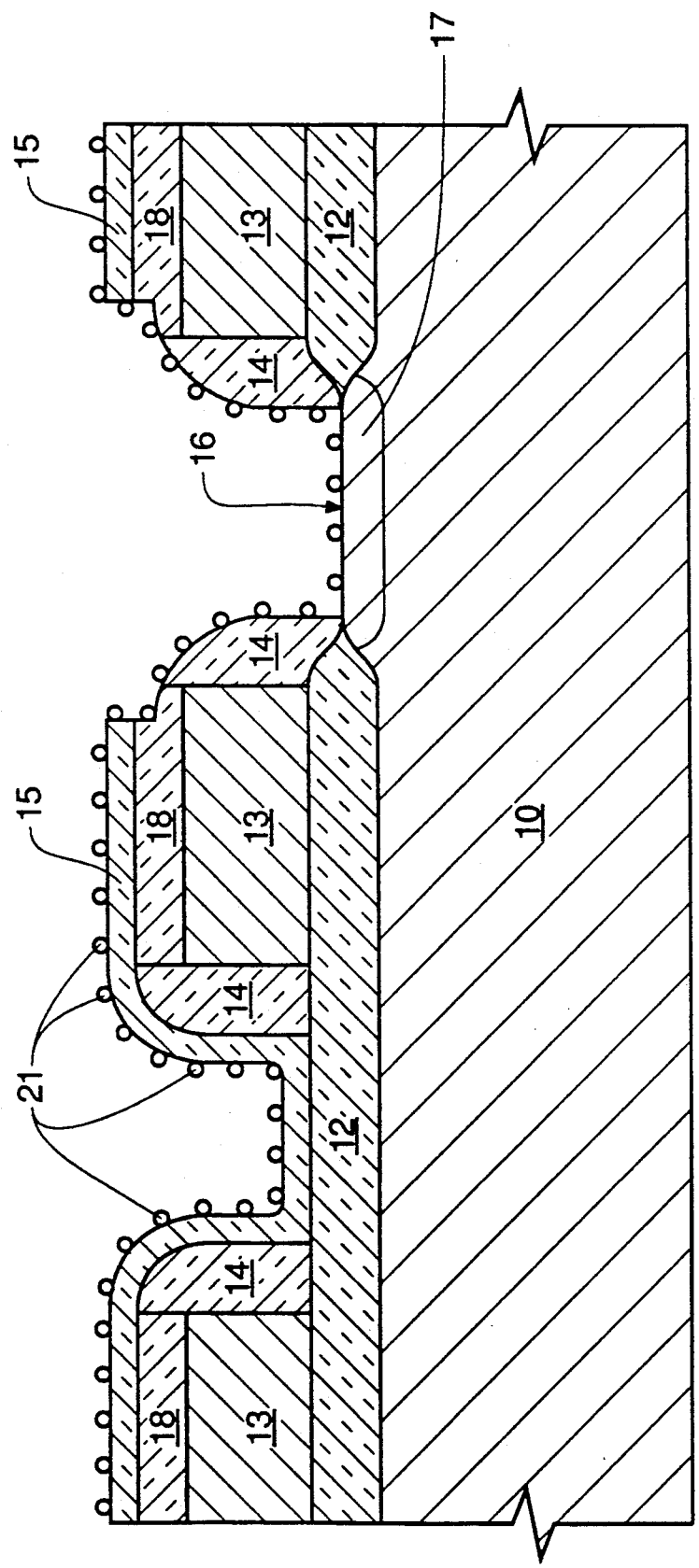
FIG. 2 is a cross-sectional view of the silicon wafer of FIG. 1 following initial stage of nucleating polysilicon during deposition.
Figure 3:
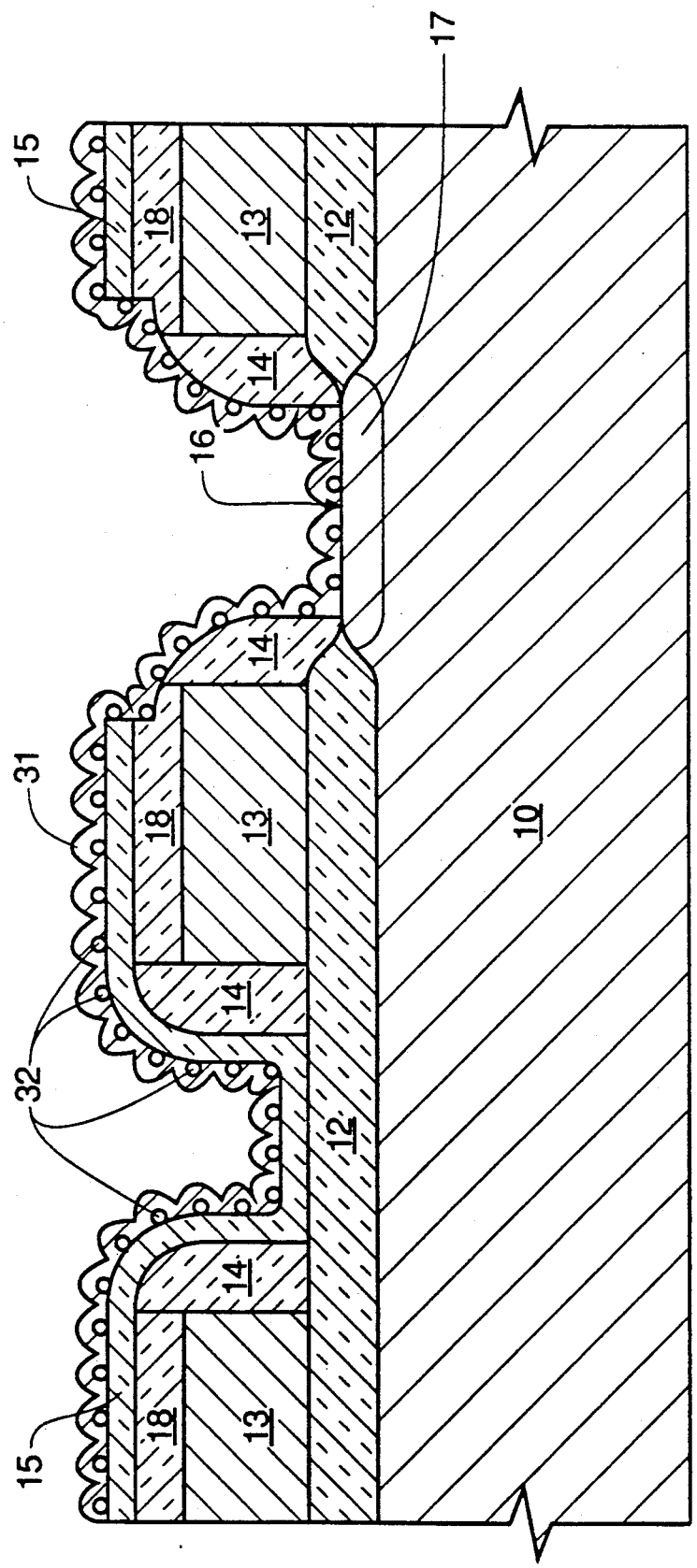
FIG. 3 is a cross-sectional view of the silicon wafer of FIG. 2 following a completed deposition of conformal polysilicon.

A preferred embodiment of the texturization process as performed on DRAM memory array, includes the steps described in FIGS. 1 through 3.

Referring now to FIG. 1, a silicon wafer 10 has been fabricated up to a point prior to formation of a poly storage node cell plate in a memory array. A conventional fabrication process to develop a standard stacked capacitor cell has developed field oxide 12 separating digit lines 13 from silicon substrate 10. Digit lines 13 are isolated by vertical dielectric spacers 14 and conformal dielectric layers 15 and 18. A buried contact location 16 has been opened to provide access to active area 17 for a storage node capacitor cell plate to be developed in the following steps.

Referring now to FIG. 2, nucleated poly 21 begins to coat exposed surfaces of dielectrics 15 and 18, vertical spacers 14, and active area 17. Poly nodules 21 are deposited by chemical vapor deposition and is caused to homogeneously nucleate in the gas phase by increasing the deposition pressure into the range of 10 Torr to 300 milliTorr or by increasing the deposition temperature into the range of 600 to 800 degrees Celsius. Alternately, conventional deposition pressures and temperatures can be employed and a heterogenous gas phase nucleation of the poly will result by introducing a material such as water vapor, oxygen, nitrous oxide, or methane. Only small concentrations of these materials in the order of 100–1000 ppm are required. Once poly nodules have been formed the temperature and pressure can be returned to a normal deposition range of 550 to 650 degrees Celsius and 100 to 300 milliTorr to discontinue homogeneous nucleation of the poly silane source. For a given pressure, higher temperatures increase gas phase nucleation. For a given temperature, higher pressures increase gas phase nucleation. This allows variation to control specific surface texture. If the heterogeneous gas phase nucleation is employed, the supply of the material introduced during deposition can simply be shut off when the desired extent of poly nodule size and density are formed.

Referring now to FIG. 3, as a polysilicon 31 deposition continues, poly nodules 21 will be repetitively covered to form a texturized surface of poly 31.

From this point on, the stacked capacitor is completed using conventional stacked capacitor fabrication techniques for DRAMs.

Although the preferred embodiment focuses on using the process developed in the present invention during a conventional stacked capacitor DRAM fabrication process, it will be apparent to one skilled-in-the-art that the techniques described by the present invention may be applied to various semiconductor fabrication processes where polysilicon is used and it is desired to have that polysilicon take on a texturized surface. It will also be apparent to one skilled-in-the-art that changes and modifications may be made thereto without departing from the spirit and scope of the invention as claimed.

I claim:

1. A process for forming a textured polycrystalline silicon layer on a silicon wafer surface, comprising the following steps:
   a) depositing an initial polycrystalline silicon by chemical vapor deposition utilizing a polysilicon source gas whereby varying a combination of deposition conditions causes gas phase nucleation of said initial polycrystalline silicon thereby forming poly nodules; and
   b) depositing subsequent conformal polycrystalline silicon layers superjacent said wafer surface thereby coating said poly nodules and causing said initial polycrystalline silicon to become texturized.

2. The process of claim 1 wherein said combination of deposition conditions is selected essentially from the group of increasing deposition temperature to a range between 600 to 800 degrees Celsius, increasing pressure to a range between 10 Torr to 300 milliTorr, thereby causing said gas phase nucleation to be homogeneous.

3. The process of claim 1 wherein said polysilicon source gas is selected from the group consisting essentially of silane, dichlorosilane, trichlorosilane, tetrachlorosilane and disilane.

4. The process of claim 1 wherein said combination of deposition conditions comprises injecting a material that causes said gas phase nucleation to be heterogeneous.

5. The process of claim 4 wherein said material is selected from the group consisting essentially of oxygen, water vapor, nitrous oxide and methane.

6. A process for texturizing a polysilicon storage node capacitor cell plate in a semiconductor memory integrated circuit fabricated on a silicon wafer, comprising the following steps:
   a) depositing an initial polycrystalline silicon by chemical vapor deposition utilizing a polysilicon source gas whereby varying a combination of deposition conditions causes gas phase nucleation of said initial polycrystalline silicon thereby forming poly nodules; and
   b) depositing subsequent conformal polycrystalline silicon layers superjacent said wafer surface thereby coating said poly nodules and causing said initial polycrystalline silicon to become texturized.

7. The process of claim 6 wherein said combination of deposition conditions is selected essentially from the group of increasing deposition temperature to a range between 600 to 800 degrees Celsius, increasing pressure to a range between 10 Torr to 300 milliTorr, thereby causing said gas phase nucleation to be homogeneous.

8. The process of claim 6 wherein said polysilicon source gas is selected from the group consisting essentially of silane, dichlorosilane, trichlorosilane, tetrachlorosilane and disilane.

9. The process of claim 6 wherein said combination of deposition conditions comprises injecting a material that causes said gas phase nucleation to be heterogeneous.

10. The process of claim 6 wherein said material is selected from the group consisting essentially of oxygen, water vapor, nitrous oxide and methane.

11. The process of claim 6 wherein said memory integrated circuit is a dynamic random access memory.

12. A process for texturizing a polysilicon storage node capacitor cell plate in a DRAM fabricated on a silicon wafer, comprising the following steps:
   a) depositing an initial polycrystalline silicon by chemical vapor deposition utilizing a polysilicon source gas whereby varying a combination of deposition conditions causes gas phase nucleation of said initial polycrystalline silicon thereby forming poly nodules; and
   b) depositing subsequent conformal polycrystalline silicon layers superjacent said wafer surface thereby coating said poly nodules and causing said polysilicon storage node capacitor cell plate to become texturized.

13. The process of claim 12 wherein said polysilicon source gas is selected from the group consisting essentially of silane, dichlorosilane, trichlorosilane, tetrachlorosilane and disilane.

14. The process of claim 12 wherein said combination of deposition conditions is selected from the group of increasing deposition temperature to a range between 600 to 800 degrees Celsius, increasing pressure to a range between 10 Torr to 300 milliTorr, thereby causing said gas phase nucleation to be homogeneous.

15. The process of claim 12 wherein said combination of deposition conditions comprises injecting a material that causes said gas phase nucleation to be heterogeneous.

16. The process of claim 15 wherein said material is selected from the group consisting essentially of oxygen, water vapor, nitrous oxide and methane.

* * * * *

UNITED STATES PATENT AND TRADEMARK OFFICE
CERTIFICATE OF CORRECTION

PATENT NO. : 5,112,773
DATED : May 12, 1992
INVENTOR(S) : Mark E. Tuttle

It is certified that error appears in the above-indentified patent and that said Letters Patent is hereby corrected as shown below:

Column 3, lines 27-28, delete "causing said initial polycrystalline silicon to become texturized." and insert -- forming the texturized polycrystalline silicon layer. --.

Column 3, line 46, delete "texturizing a" and insert -- forming a texturized --.

Column 4, lines 3-4, please delete "causing said initial polycrystalline silicon to become texturized." and insert -- forming the texturized polysilicon storage node capacitor cell plate. --.

Column 4, line 19, delete "6" and insert -- 9 --.

Column 4, line 24, delete "texturizing a" and insert -- forming a texturized --.

Column 4, line 35-37, delete "causing said polysilicon storage node capacitor cell plate to become texturized." and insert -- forming the texturized polysilicon storage node capacitor cell plate --.

Signed and Sealed this

Eleventh Day of January, 1994

Attest:

BRUCE LEHMAN

*Attesting Officer*  *Commissioner of Patents and Trademarks*